(12) United States Patent
Kowal et al.

(10) Patent No.: US 12,247,851 B2
(45) Date of Patent: *Mar. 11, 2025

(54) HALL SENSOR—MAGNET GEOMETRY FOR LARGE STROKE LINEAR POSITION SENSING

(71) Applicant: Corephotonics Ltd., Tel Aviv (IL)

(72) Inventors: Yiftah Kowal, Tel Aviv (IL); Nadav Goulinski, Tel Aviv (IL); Tal Korman, Tel Aviv (IL); Ephraim Goldenberg, Tel Aviv (IL)

(73) Assignee: Corephotonics Ltd., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/591,012

(22) Filed: Feb. 29, 2024

(65) Prior Publication Data

US 2024/0247953 A1 Jul. 25, 2024

Related U.S. Application Data

(63) Continuation of application No. 17/628,905, filed as application No. PCT/IB2021/056693 on Jul. 26, 2021, now Pat. No. 11,946,775.

(Continued)

(51) Int. Cl.
*G01D 5/14* (2006.01)
(52) U.S. Cl.
CPC .................... *G01D 5/145* (2013.01)
(58) Field of Classification Search
CPC ......................................... G01D 5/145
See application file for complete search history.

(56) References Cited

U.S. PATENT DOCUMENTS 3,085,354 A 4/1963 Rasmussen et al.
3,584,513 A 6/1971 Gates
(Continued)

FOREIGN PATENT DOCUMENTS

CN 101276415 A 10/2008
CN 201514511 U 6/2010
(Continued)

OTHER PUBLICATIONS

Zitova Bet al: "Image Registration Methods: a Survey", Image and Vision Computing, Elsevier, Guildford, GB, vol. 21, No. 11, Oct. 1, 2003 (Oct. 1, 2003), pp. 977-1000, XP00i 189327, ISSN: 0262-8856, DOI: 10_i0i6/ S0262-8856(03)00137-9.

(Continued)

*Primary Examiner* — Reena Aurora
(74) *Attorney, Agent, or Firm* — Nathan & Associates; Menachem Nathan

(57) ABSTRACT

Position sensing units, comprising a magnetic assembly (MA) having a width W measured along a first direction and a height H measured along a second direction and including at least three magnets having respective magnetic polarizations that define along the first direction at least a left MA domain, a middle MA domain and a right MA domain, wherein the magnetic polarizations of each MA domain are different, and a magnetic flux measuring device (MFMD) for measuring a magnetic flux B, wherein the MA moves relative to the MFMD along the first direction within a stroke L that fulfils 1 mm≤L≤100 mm, stroke L beginning at a first point $x_0$ and ending at a final point $x_{max}$, and wherein a minimum value $D_{min}$ of an orthogonal distance D, measured along the second direction between a particular MA domain and the MFMD, fulfills $L/D_{min} > 10$.

20 Claims, 7 Drawing Sheets

Related U.S. Application Data

(60) Provisional application No. 63/059,200, filed on Jul. 31, 2020.

(56) References Cited

U.S. PATENT DOCUMENTS

| | | |
|---|---|---|
| 3,941,001 A | 3/1976 | LaSarge |
| 4,199,785 A | 4/1980 | McCullough et al. |
| 4,792,822 A | 12/1988 | Akiyama et al. |
| 5,005,083 A | 4/1991 | Grage et al. |
| 5,032,917 A | 7/1991 | Aschwanden |
| 5,041,852 A | 8/1991 | Misawa et al. |
| 5,051,830 A | 9/1991 | von Hoessle |
| 5,099,263 A | 3/1992 | Matsumoto et al. |
| 5,248,971 A | 9/1993 | Mandl |
| 5,287,093 A | 2/1994 | Amano et al. |
| 5,331,465 A | 7/1994 | Miyano |
| 5,394,520 A | 2/1995 | Hall |
| 5,436,660 A | 7/1995 | Sakamoto |
| 5,444,478 A | 8/1995 | Lelong et al. |
| 5,459,520 A | 10/1995 | Sasaki |
| 5,502,537 A | 3/1996 | Utagawa |
| 5,657,402 A | 8/1997 | Bender et al. |
| 5,682,198 A | 10/1997 | Katayama et al. |
| 5,768,443 A | 6/1998 | Michael et al. |
| 5,892,855 A | 4/1999 | Kakinami et al. |
| 5,926,190 A | 7/1999 | Turkowski et al. |
| 5,940,641 A | 8/1999 | McIntyre et al. |
| 5,982,951 A | 11/1999 | Katayama et al. |
| 6,101,334 A | 8/2000 | Fantone |
| 6,128,416 A | 10/2000 | Oura |
| 6,148,120 A | 11/2000 | Sussman |
| 6,201,533 B1 | 3/2001 | Rosenberg et al. |
| 6,208,765 B1 | 3/2001 | Bergen |
| 6,211,668 B1 | 4/2001 | Duesler et al. |
| 6,215,299 B1 | 4/2001 | Reynolds et al. |
| 6,222,359 B1 | 4/2001 | Duesler et al. |
| 6,268,611 B1 | 7/2001 | Pettersson et al. |
| 6,520,643 B1 | 2/2003 | Holman et al. |
| 6,549,215 B2 | 4/2003 | Jouppi |
| 6,611,289 B1 | 8/2003 | Yu et al. |
| 6,643,416 B1 | 11/2003 | Daniels et al. |
| 6,650,368 B1 | 11/2003 | Doron |
| 6,680,748 B1 | 1/2004 | Monti |
| 6,714,665 B1 | 3/2004 | Hanna et al. |
| 6,724,421 B1 | 4/2004 | Glatt |
| 6,738,073 B2 | 5/2004 | Park et al. |
| 6,741,250 B1 | 5/2004 | Furlan et al. |
| 6,750,903 B1 | 6/2004 | Miyatake et al. |
| 6,778,207 B1 | 8/2004 | Lee et al. |
| 7,002,583 B2 | 2/2006 | Rabb, III |
| 7,015,954 B1 | 3/2006 | Foote et al. |
| 7,038,716 B2 | 5/2006 | Klein et al. |
| 7,199,348 B2 | 4/2007 | Olsen et al. |
| 7,206,136 B2 | 4/2007 | Labaziewicz et al. |
| 7,248,294 B2 | 7/2007 | Slatter |
| 7,256,944 B2 | 8/2007 | Labaziewicz et al. |
| 7,305,180 B2 | 12/2007 | Labaziewicz et al. |
| 7,339,621 B2 | 3/2008 | Fortier |
| 7,346,217 B1 | 3/2008 | Gold, Jr. |
| 7,365,793 B2 | 4/2008 | Cheatle et al. |
| 7,411,610 B2 | 8/2008 | Doyle |
| 7,424,218 B2 | 9/2008 | Baudisch et al. |
| 7,509,041 B2 | 3/2009 | Hosono |
| 7,533,819 B2 | 5/2009 | Barkan et al. |
| 7,619,683 B2 | 11/2009 | Davis |
| 7,738,016 B2 | 6/2010 | Toyofuku |
| 7,773,121 B1 | 8/2010 | Huntsberger et al. |
| 7,809,256 B2 | 10/2010 | Kuroda et al. |
| 7,880,776 B2 | 2/2011 | LeGall et al. |
| 7,918,398 B2 | 4/2011 | Li et al. |
| 7,964,835 B2 | 6/2011 | Olsen et al. |
| 7,978,239 B2 | 7/2011 | Deever et al. |
| 8,115,825 B2 | 2/2012 | Culbert et al. |
| 8,149,327 B2 | 4/2012 | Lin et al. |
| 8,154,610 B2 | 4/2012 | Jo et al. |
| 8,238,695 B1 | 8/2012 | Davey et al. |
| 8,274,552 B2 | 9/2012 | Dahi et al. |
| 8,390,729 B2 | 3/2013 | Long et al. |
| 8,391,697 B2 | 3/2013 | Cho et al. |
| 8,400,555 B1 | 3/2013 | Georgiev et al. |
| 8,439,265 B2 | 5/2013 | Ferren et al. |
| 8,446,484 B2 | 5/2013 | Muukki et al. |
| 8,483,452 B2 | 7/2013 | Ueda et al. |
| 8,514,491 B2 | 8/2013 | Duparre |
| 8,547,389 B2 | 10/2013 | Hoppe et al. |
| 8,553,106 B2 | 10/2013 | Scarff |
| 8,587,691 B2 | 11/2013 | Takane |
| 8,619,148 B1 | 12/2013 | Watts et al. |
| 8,752,969 B1 | 6/2014 | Kane et al. |
| 8,803,990 B2 | 8/2014 | Smith |
| 8,896,655 B2 | 11/2014 | Mauchly et al. |
| 8,976,255 B2 | 3/2015 | Matsuoto et al. |
| 9,019,387 B2 | 4/2015 | Nakano |
| 9,025,073 B2 | 5/2015 | Attar et al. |
| 9,025,077 B2 | 5/2015 | Attar et al. |
| 9,041,835 B2 | 5/2015 | Honda |
| 9,137,447 B2 | 9/2015 | Shibuno |
| 9,185,291 B1 | 11/2015 | Shabtay et al. |
| 9,215,377 B2 | 12/2015 | Sokeila et al. |
| 9,215,385 B2 | 12/2015 | Luo |
| 9,270,875 B2 | 2/2016 | Brisedoux et al. |
| 9,286,680 B1 | 3/2016 | Jiang et al. |
| 9,344,626 B2 | 5/2016 | Silverstein et al. |
| 9,360,671 B1 | 6/2016 | Zhou |
| 9,369,621 B2 | 6/2016 | Malone et al. |
| 9,413,930 B2 | 8/2016 | Geerds |
| 9,413,984 B2 | 8/2016 | Attar et al. |
| 9,420,180 B2 | 8/2016 | Jin |
| 9,438,792 B2 | 9/2016 | Nakada et al. |
| 9,485,432 B1 | 11/2016 | Medasani et al. |
| 9,578,257 B2 | 2/2017 | Attar et al. |
| 9,618,748 B2 | 4/2017 | Munger et al. |
| 9,681,057 B2 | 6/2017 | Attar et al. |
| 9,723,220 B2 | 8/2017 | Sugie |
| 9,736,365 B2 | 8/2017 | Laroia |
| 9,736,391 B2 | 8/2017 | Du et al. |
| 9,768,310 B2 | 9/2017 | Ahn et al. |
| 9,800,798 B2 | 10/2017 | Ravirala et al. |
| 9,851,803 B2 | 12/2017 | Fisher et al. |
| 9,894,287 B2 | 2/2018 | Qian et al. |
| 9,900,522 B2 | 2/2018 | Lu |
| 9,927,600 B2 | 3/2018 | Goldenberg et al. |
| 11,700,441 B1 * | 7/2023 | Shahparnia ............ G01R 33/07 |
| 11,946,775 B2 * | 4/2024 | Kowal ............... G01R 33/0005 |
| 2002/0005902 A1 | 1/2002 | Yuen |
| 2002/0030163 A1 | 3/2002 | Zhang |
| 2002/0054214 A1 | 5/2002 | Yoshikawa |
| 2002/0063711 A1 | 5/2002 | Park et al. |
| 2002/0075258 A1 | 6/2002 | Park et al. |
| 2002/0122113 A1 | 9/2002 | Foote |
| 2002/0136554 A1 | 9/2002 | Nomura et al. |
| 2002/0167741 A1 | 11/2002 | Koiwai et al. |
| 2003/0030729 A1 | 2/2003 | Prentice et al. |
| 2003/0093805 A1 | 5/2003 | Gin |
| 2003/0156751 A1 | 8/2003 | Lee et al. |
| 2003/0160886 A1 | 8/2003 | Misawa et al. |
| 2003/0162564 A1 | 8/2003 | Kimura et al. |
| 2003/0202113 A1 | 10/2003 | Yoshikawa |
| 2004/0008773 A1 | 1/2004 | Itokawa |
| 2004/0012683 A1 | 1/2004 | Yamasaki et al. |
| 2004/0017386 A1 | 1/2004 | Liu et al. |
| 2004/0027367 A1 | 2/2004 | Pilu |
| 2004/0061788 A1 | 4/2004 | Bateman |
| 2004/0141065 A1 | 7/2004 | Hara et al. |
| 2004/0141086 A1 | 7/2004 | Mihara |
| 2004/0227838 A1 | 11/2004 | Atarashi et al. |
| 2004/0239313 A1 | 12/2004 | Godkin |
| 2004/0240052 A1 | 12/2004 | Minefuji et al. |
| 2005/0013509 A1 | 1/2005 | Samadani |
| 2005/0046740 A1 | 3/2005 | Davis |
| 2005/0134697 A1 | 6/2005 | Mikkonen et al. |
| 2005/0141390 A1 | 6/2005 | Lee et al. |
| 2005/0157184 A1 | 7/2005 | Nakanishi et al. |
| 2005/0168834 A1 | 8/2005 | Matsumoto et al. |

(56) References Cited

U.S. PATENT DOCUMENTS

| | | |
|---|---|---|
| 2005/0185049 A1 | 8/2005 | Iwai et al. |
| 2005/0200718 A1 | 9/2005 | Lee |
| 2005/0248667 A1 | 11/2005 | Schweng et al. |
| 2006/0054782 A1 | 3/2006 | Olsen et al. |
| 2006/0056056 A1 | 3/2006 | Ahiska et al. |
| 2006/0067672 A1 | 3/2006 | Washisu et al. |
| 2006/0102907 A1 | 5/2006 | Lee et al. |
| 2006/0125937 A1 | 6/2006 | LeGall et al. |
| 2006/0126737 A1 | 6/2006 | Boice et al. |
| 2006/0170793 A1 | 8/2006 | Pasquarette et al. |
| 2006/0175549 A1 | 8/2006 | Miller et al. |
| 2006/0181619 A1 | 8/2006 | Liow et al. |
| 2006/0187310 A1 | 8/2006 | Janson et al. |
| 2006/0187322 A1 | 8/2006 | Janson et al. |
| 2006/0187338 A1 | 8/2006 | May et al. |
| 2006/0227236 A1 | 10/2006 | Pak |
| 2007/0024737 A1 | 2/2007 | Nakamura et al. |
| 2007/0114990 A1 | 5/2007 | Godkin |
| 2007/0126911 A1 | 6/2007 | Nanjo |
| 2007/0127040 A1 | 6/2007 | Davidovici |
| 2007/0159344 A1 | 7/2007 | Kisacanin |
| 2007/0177025 A1 | 8/2007 | Kopet et al. |
| 2007/0188653 A1 | 8/2007 | Pollock et al. |
| 2007/0189386 A1 | 8/2007 | Imagawa et al. |
| 2007/0257184 A1 | 11/2007 | Olsen et al. |
| 2007/0285550 A1 | 12/2007 | Son |
| 2008/0017557 A1 | 1/2008 | Witdouck |
| 2008/0024614 A1 | 1/2008 | Li et al. |
| 2008/0025634 A1 | 1/2008 | Border et al. |
| 2008/0030592 A1 | 2/2008 | Border et al. |
| 2008/0030611 A1 | 2/2008 | Jenkins |
| 2008/0084484 A1 | 4/2008 | Ochi et al. |
| 2008/0088942 A1 | 4/2008 | Seo |
| 2008/0106629 A1 | 5/2008 | Kurtz et al. |
| 2008/0117316 A1 | 5/2008 | Orimoto |
| 2008/0129831 A1 | 6/2008 | Cho et al. |
| 2008/0218611 A1 | 9/2008 | Parulski et al. |
| 2008/0218612 A1 | 9/2008 | Border et al. |
| 2008/0218613 A1 | 9/2008 | Janson et al. |
| 2008/0219654 A1 | 9/2008 | Border et al. |
| 2009/0086074 A1 | 4/2009 | Li et al. |
| 2009/0102948 A1 | 4/2009 | Scherling |
| 2009/0109556 A1 | 4/2009 | Shimizu et al. |
| 2009/0122195 A1 | 5/2009 | Van Baar et al. |
| 2009/0122406 A1 | 5/2009 | Rouvinen et al. |
| 2009/0128644 A1 | 5/2009 | Camp et al. |
| 2009/0168135 A1 | 7/2009 | Yu et al. |
| 2009/0200451 A1 | 8/2009 | Conners |
| 2009/0219547 A1 | 9/2009 | Kauhanen et al. |
| 2009/0234542 A1 | 9/2009 | Orlewski |
| 2009/0252484 A1 | 10/2009 | Hasuda et al. |
| 2009/0295949 A1 | 12/2009 | Ojala |
| 2009/0295986 A1 | 12/2009 | Topliss et al. |
| 2009/0324135 A1 | 12/2009 | Kondo et al. |
| 2010/0013906 A1 | 1/2010 | Border et al. |
| 2010/0020221 A1 | 1/2010 | Tupman et al. |
| 2010/0060746 A9 | 3/2010 | Olsen et al. |
| 2010/0097444 A1 | 4/2010 | Lablans |
| 2010/0103194 A1 | 4/2010 | Chen et al. |
| 2010/0134621 A1 | 6/2010 | Namkoong et al. |
| 2010/0165131 A1 | 7/2010 | Makimoto et al. |
| 2010/0196001 A1 | 8/2010 | Ryynänen et al. |
| 2010/0202068 A1 | 8/2010 | Ito |
| 2010/0238327 A1 | 9/2010 | Griffith et al. |
| 2010/0246024 A1 | 9/2010 | Aoki et al. |
| 2010/0259836 A1 | 10/2010 | Kang et al. |
| 2010/0265331 A1 | 10/2010 | Tanaka |
| 2010/0283842 A1 | 11/2010 | Guissin et al. |
| 2010/0321494 A1 | 12/2010 | Peterson et al. |
| 2011/0043193 A1 | 2/2011 | Aebi et al. |
| 2011/0058320 A1 | 3/2011 | Kim et al. |
| 2011/0063417 A1 | 3/2011 | Peters et al. |
| 2011/0063446 A1 | 3/2011 | McMordie et al. |
| 2011/0064327 A1 | 3/2011 | Dagher et al. |
| 2011/0080487 A1 | 4/2011 | Venkataraman et al. |
| 2011/0121666 A1 | 5/2011 | Park et al. |
| 2011/0128288 A1 | 6/2011 | Petrou et al. |
| 2011/0164172 A1 | 7/2011 | Shintani et al. |
| 2011/0221599 A1 | 9/2011 | Högasten |
| 2011/0229054 A1 | 9/2011 | Weston et al. |
| 2011/0234798 A1 | 9/2011 | Chou |
| 2011/0234853 A1 | 9/2011 | Hayashi et al. |
| 2011/0234881 A1 | 9/2011 | Wakabayashi et al. |
| 2011/0242286 A1 | 10/2011 | Pace et al. |
| 2011/0242355 A1 | 10/2011 | Goma et al. |
| 2011/0285714 A1 | 11/2011 | Swic et al. |
| 2011/0298966 A1 | 12/2011 | Kirschstein et al. |
| 2012/0014682 A1 | 1/2012 | David et al. |
| 2012/0026366 A1 | 2/2012 | Golan et al. |
| 2012/0044372 A1 | 2/2012 | Cote et al. |
| 2012/0062780 A1 | 3/2012 | Morihisa |
| 2012/0069235 A1 | 3/2012 | Imai |
| 2012/0075489 A1 | 3/2012 | Nishihara |
| 2012/0105579 A1 | 5/2012 | Jeon et al. |
| 2012/0124525 A1 | 5/2012 | Kang |
| 2012/0154547 A1 | 6/2012 | Aizawa |
| 2012/0154614 A1 | 6/2012 | Moriya et al. |
| 2012/0196648 A1 | 8/2012 | Havens et al. |
| 2012/0229663 A1 | 9/2012 | Nelson et al. |
| 2012/0249815 A1 | 10/2012 | Bohn et al. |
| 2012/0287315 A1 | 11/2012 | Huang et al. |
| 2012/0320467 A1 | 12/2012 | Baik et al. |
| 2013/0002928 A1 | 1/2013 | Imai |
| 2013/0016427 A1 | 1/2013 | Sugawara |
| 2013/0063629 A1 | 3/2013 | Webster et al. |
| 2013/0076922 A1 | 3/2013 | Shihoh et al. |
| 2013/0093842 A1 | 4/2013 | Yahata |
| 2013/0094126 A1 | 4/2013 | Rappoport et al. |
| 2013/0113894 A1 | 5/2013 | Mirlay |
| 2013/0135445 A1 | 5/2013 | Dahi et al. |
| 2013/0148215 A1 | 6/2013 | Mori et al. |
| 2013/0148854 A1 | 6/2013 | Wang et al. |
| 2013/0155176 A1 | 6/2013 | Paripally et al. |
| 2013/0163085 A1 | 6/2013 | Lim et al. |
| 2013/0182150 A1 | 7/2013 | Asakura |
| 2013/0201360 A1 | 8/2013 | Song |
| 2013/0202273 A1 | 8/2013 | Ouedraogo et al. |
| 2013/0229544 A1 | 9/2013 | Bando |
| 2013/0235224 A1 | 9/2013 | Park et al. |
| 2013/0250150 A1 | 9/2013 | Malone et al. |
| 2013/0258044 A1 | 10/2013 | Betts-LaCroix |
| 2013/0258048 A1 | 10/2013 | Wang et al. |
| 2013/0270419 A1 | 10/2013 | Singh et al. |
| 2013/0278785 A1 | 10/2013 | Nomura et al. |
| 2013/0286221 A1 | 10/2013 | Shechtman et al. |
| 2013/0321668 A1 | 12/2013 | Kamath |
| 2014/0009631 A1 | 1/2014 | Topliss |
| 2014/0049615 A1 | 2/2014 | Uwagawa |
| 2014/0118584 A1 | 5/2014 | Lee et al. |
| 2014/0160311 A1 | 6/2014 | Hwang et al. |
| 2014/0192224 A1 | 7/2014 | Laroia |
| 2014/0192238 A1 | 7/2014 | Attar et al. |
| 2014/0192253 A1 | 7/2014 | Laroia |
| 2014/0218587 A1 | 8/2014 | Shah |
| 2014/0313316 A1 | 10/2014 | Olsson et al. |
| 2014/0362242 A1 | 12/2014 | Takizawa |
| 2014/0376090 A1 | 12/2014 | Terajima |
| 2014/0379103 A1 | 12/2014 | Ishikawa et al. |
| 2015/0002683 A1 | 1/2015 | Hu et al. |
| 2015/0002684 A1 | 1/2015 | Kuchiki |
| 2015/0042870 A1 | 2/2015 | Chan et al. |
| 2015/0070781 A1 | 3/2015 | Cheng et al. |
| 2015/0086127 A1 | 3/2015 | Camilus et al. |
| 2015/0092066 A1 | 4/2015 | Geiss et al. |
| 2015/0103147 A1 | 4/2015 | Ho et al. |
| 2015/0110345 A1 | 4/2015 | Weichselbaum |
| 2015/0124059 A1 | 5/2015 | Georgiev et al. |
| 2015/0138381 A1 | 5/2015 | Ahn |
| 2015/0145965 A1 | 5/2015 | Livyatan et al. |
| 2015/0154776 A1 | 6/2015 | Zhang et al. |
| 2015/0162048 A1 | 6/2015 | Hirata et al. |
| 2015/0181115 A1 | 6/2015 | Mashiah |
| 2015/0195458 A1 | 7/2015 | Nakayama et al. |
| 2015/0198464 A1 | 7/2015 | El Alami |

(56) References Cited

U.S. PATENT DOCUMENTS

| | | |
|---|---|---|
| 2015/0215516 A1 | 7/2015 | Dolgin |
| 2015/0237280 A1 | 8/2015 | Choi et al. |
| 2015/0242994 A1 | 8/2015 | Shen |
| 2015/0244906 A1 | 8/2015 | Wu et al. |
| 2015/0253543 A1 | 9/2015 | Mercado |
| 2015/0253647 A1 | 9/2015 | Mercado |
| 2015/0261299 A1 | 9/2015 | Wajs |
| 2015/0271471 A1 | 9/2015 | Hsieh et al. |
| 2015/0281678 A1 | 10/2015 | Park et al. |
| 2015/0286033 A1 | 10/2015 | Osborne |
| 2015/0296112 A1 | 10/2015 | Park et al. |
| 2015/0316744 A1 | 11/2015 | Chen |
| 2015/0334309 A1 | 11/2015 | Peng et al. |
| 2016/0028949 A1 | 1/2016 | Lee et al. |
| 2016/0044250 A1 | 2/2016 | Shabtay et al. |
| 2016/0070088 A1 | 3/2016 | Koguchi |
| 2016/0154066 A1 | 6/2016 | Hioka et al. |
| 2016/0154202 A1 | 6/2016 | Wippermann et al. |
| 2016/0154204 A1 | 6/2016 | Lim et al. |
| 2016/0212358 A1 | 7/2016 | Shikata |
| 2016/0212418 A1 | 7/2016 | Demirdjian et al. |
| 2016/0238834 A1 | 8/2016 | Erlich et al. |
| 2016/0241751 A1 | 8/2016 | Park |
| 2016/0245669 A1 | 8/2016 | Nomura |
| 2016/0291295 A1 | 10/2016 | Shabtay et al. |
| 2016/0295112 A1 | 10/2016 | Georgiev et al. |
| 2016/0301840 A1 | 10/2016 | Du et al. |
| 2016/0301868 A1 | 10/2016 | Acharya et al. |
| 2016/0342095 A1 | 11/2016 | Bieling et al. |
| 2016/0353008 A1 | 12/2016 | Osborne |
| 2016/0353012 A1 | 12/2016 | Kao et al. |
| 2016/0381289 A1 | 12/2016 | Kim et al. |
| 2017/0001577 A1 | 1/2017 | Seagraves et al. |
| 2017/0019616 A1 | 1/2017 | Zhu et al. |
| 2017/0070731 A1 | 3/2017 | Darling et al. |
| 2017/0094187 A1 | 3/2017 | Sharma et al. |
| 2017/0124987 A1 | 5/2017 | Kim et al. |
| 2017/0150061 A1 | 5/2017 | Shabtay et al. |
| 2017/0187962 A1 | 6/2017 | Lee et al. |
| 2017/0214846 A1 | 7/2017 | Du et al. |
| 2017/0214866 A1 | 7/2017 | Zhu et al. |
| 2017/0219749 A1 | 8/2017 | Hou et al. |
| 2017/0242225 A1 | 8/2017 | Fiske |
| 2017/0276954 A1 | 9/2017 | Bajorins et al. |
| 2017/0289458 A1 | 10/2017 | Song et al. |
| 2018/0003925 A1 | 1/2018 | Shmunk |
| 2018/0013944 A1 | 1/2018 | Evans, V et al. |
| 2018/0017844 A1 | 1/2018 | Yu et al. |
| 2018/0024329 A1 | 1/2018 | Goldenberg et al. |
| 2018/0059379 A1 | 3/2018 | Chou |
| 2018/0109660 A1 | 4/2018 | Yoon et al. |
| 2018/0109710 A1 | 4/2018 | Lee et al. |
| 2018/0120674 A1 | 5/2018 | Avivi et al. |
| 2018/0150973 A1 | 5/2018 | Tang et al. |
| 2018/0176426 A1 | 6/2018 | Wei et al. |
| 2018/0184010 A1 | 6/2018 | Cohen et al. |
| 2018/0198897 A1 | 7/2018 | Tang et al. |
| 2018/0216925 A1 | 8/2018 | Yasuda et al. |
| 2018/0241922 A1 | 8/2018 | Baldwin et al. |
| 2018/0249090 A1 | 8/2018 | Nakagawa et al. |
| 2018/0295292 A1 | 10/2018 | Lee et al. |
| 2018/0300901 A1 | 10/2018 | Wakai et al. |
| 2018/0307005 A1 | 10/2018 | Price et al. |
| 2018/0329281 A1 | 11/2018 | Ye |
| 2018/0368656 A1 | 12/2018 | Austin et al. |
| 2019/0089941 A1 | 3/2019 | Bigioi et al. |
| 2019/0096047 A1 | 3/2019 | Ogasawara |
| 2019/0100156 A1 | 4/2019 | Chung et al. |
| 2019/0121103 A1 | 4/2019 | Bachar et al. |
| 2019/0121216 A1 | 4/2019 | Shabtay et al. |
| 2019/0130822 A1 | 5/2019 | Jung et al. |
| 2019/0154466 A1 | 5/2019 | Fletcher |
| 2019/0213712 A1 | 7/2019 | Lashdan et al. |
| 2019/0215440 A1 | 7/2019 | Rivard et al. |
| 2019/0222758 A1 | 7/2019 | Goldenberg et al. |
| 2019/0227338 A1 | 7/2019 | Bachar et al. |
| 2019/0228562 A1 | 7/2019 | Song |
| 2019/0297238 A1 | 9/2019 | Klosterman |
| 2019/0320119 A1 | 10/2019 | Miyoshi |
| 2020/0014912 A1 | 1/2020 | Kytsun et al. |
| 2020/0092486 A1 | 3/2020 | Guo et al. |
| 2020/0103726 A1 | 4/2020 | Shabtay et al. |
| 2020/0104034 A1 | 4/2020 | Lee et al. |
| 2020/0118287 A1 | 4/2020 | Hsieh et al. |
| 2020/0134848 A1 | 4/2020 | El-Khamy et al. |
| 2020/0162682 A1 | 5/2020 | Cheng et al. |
| 2020/0221026 A1 | 7/2020 | Fridman et al. |
| 2020/0264403 A1 | 8/2020 | Bachar et al. |
| 2020/0389580 A1 | 12/2020 | Kodama et al. |
| 2021/0180989 A1 | 6/2021 | Fukumura et al. |
| 2021/0208415 A1 | 7/2021 | Goldenberg et al. |
| 2021/0333521 A9 | 10/2021 | Yedid et al. |
| 2022/0252963 A1 | 8/2022 | Shabtay et al. |
| 2022/0368814 A1 | 11/2022 | Topliss et al. |

FOREIGN PATENT DOCUMENTS

| | | |
|---|---|---|
| CN | 102130567 A | 7/2011 |
| CN | 102215373 A | 10/2011 |
| CN | 102739949 A | 10/2012 |
| CN | 102982518 A | 3/2013 |
| CN | 103024272 A | 4/2013 |
| CN | 203406908 U | 1/2014 |
| CN | 103841404 A | 6/2014 |
| CN | 205301703 U | 6/2016 |
| CN | 105827903 A | 8/2016 |
| CN | 105847662 A | 8/2016 |
| CN | 107608052 A | 1/2018 |
| CN | 107682489 A | 2/2018 |
| CN | 109729266 A | 5/2019 |
| EP | 1536633 A1 | 6/2005 |
| EP | 1780567 A1 | 5/2007 |
| EP | 2523450 A1 | 11/2012 |
| JP | S59191146 A | 10/1984 |
| JP | 04211230 A | 8/1992 |
| JP | H07318864 A | 12/1995 |
| JP | 08271976 A | 10/1996 |
| JP | 2002010276 A | 1/2002 |
| JP | 2003298920 A | 10/2003 |
| JP | 2003304024 A | 10/2003 |
| JP | 2004056779 A | 2/2004 |
| JP | 2004133054 A | 4/2004 |
| JP | 2004245982 A | 9/2004 |
| JP | 2005099265 A | 4/2005 |
| JP | 2005122084 A | 5/2005 |
| JP | 2005321592 A | 11/2005 |
| JP | 2006038891 A | 2/2006 |
| JP | 2006191411 A | 7/2006 |
| JP | 2006237914 A | 9/2006 |
| JP | 2006238325 A | 9/2006 |
| JP | 2008083377 A | 9/2006 |
| JP | 2007228006 A | 9/2007 |
| JP | 2007306282 A | 11/2007 |
| JP | 2008076485 A | 4/2008 |
| JP | 2008245142 A | 10/2008 |
| JP | 2008271026 A | 11/2008 |
| JP | 2010204341 A | 9/2010 |
| JP | 2011055246 A | 3/2011 |
| JP | 2011085666 A | 4/2011 |
| JP | 2011138407 A | 7/2011 |
| JP | 2011203283 A | 10/2011 |
| JP | 2012132739 A | 7/2012 |
| JP | 2013101213 A | 5/2013 |
| JP | 2013106289 A | 5/2013 |
| JP | 2016105577 A | 6/2016 |
| JP | 2017146440 A | 8/2017 |
| JP | 2019126179 A | 7/2019 |
| KR | 20070005946 A | 1/2007 |
| KR | 20090058229 A | 6/2009 |
| KR | 20100008936 A | 1/2010 |
| KR | 20110080590 A | 7/2011 |
| KR | 20130104764 A | 9/2013 |
| KR | 1020130135805 A | 11/2013 |
| KR | 20140014787 A | 2/2014 |

(56) References Cited

FOREIGN PATENT DOCUMENTS

| | | |
|---|---|---|
| KR | 101428042 B1 | 8/2014 |
| KR | 101477178 B1 | 12/2014 |
| KR | 20140144126 A | 12/2014 |
| KR | 20150118012 A | 10/2015 |
| KR | 20170105236 A | 9/2017 |
| KR | 20180120894 A | 11/2018 |
| KR | 20130085116 A | 6/2019 |
| TW | I407177 B | 9/2013 |
| WO | 2000027131 A2 | 5/2000 |
| WO | 2004084542 A1 | 9/2004 |
| WO | 2006008805 A1 | 1/2006 |
| WO | 2010122841 A1 | 10/2010 |
| WO | 2014072818 A2 | 5/2014 |
| WO | 2017025822 A1 | 2/2017 |
| WO | 2017037688 A1 | 3/2017 |
| WO | 2018130898 A1 | 7/2018 |

OTHER PUBLICATIONS

Office Action in related CN patent application 202180005008.5, dated Oct. 28, 2023.
Statistical Modeling and Performance Characterization of a Real-Time Dual Camera Surveillance System, Greienhagen et al., Publisher: IEEE, 2000, 8 pages.
A 3MPixel Multi-Aperture Image Sensor with 0.7μm Pixels in 0.11μm CMOS, Fife et al., Stanford University, 2008, 3 pages.
Dual camera intelligent sensor for high definition 360 degrees surveillance, Scotti et al., Publisher: IET, May 9, 2000, 8 pages.
Dual-sensor foveated imaging system, Hua et al., Publisher: Optical Society of America, Jan. 14, 2008, 11 pages.
Defocus Video Matting, McGuire et al., Publisher: ACM SIGGRAPH, Jul. 31, 2005, 11 pages.
Compact multi-aperture imaging with high angular resolution, Santacana et al., Publisher: Optical Society of America, 2015, 10 pages.
Multi-Aperture Photography, Green et al., Publisher: Mitsubishi Electric Research Laboratories, Inc., Jul. 2007, 10 pages.
Multispectral Bilateral Video Fusion, Bennett et al., Publisher: IEEE, May 2007, 10 pages.
Super-resolution imaging using a camera array, Santacana et al., Publisher: Optical Society of America, 2014, 6 pages.
Optical Splitting Trees for High-Precision Monocular Imaging, McGuire et al., Publisher: IEEE, 2007, 11 pages.
High Performance Imaging Using Large Camera Arrays, Wilburn et al., Publisher: Association for Computing Machinery, Inc., 2005, 12 pages.
Real-time Edge-Aware Image Processing with the Bilateral Grid, Chen et al., Publisher: ACM SIGGRAPH, 2007, 9 pages.
Superimposed multi-resolution imaging, Carles et al., Publisher: Optical Society of America, 2017, 13 pages.
Viewfinder Alignment, Adams et al., Publisher: Eurographics, 2008, 10 pages.
Dual-Camera System for Multi-Level Activity Recognition, Bodor et al., Publisher: IEEE, Oct. 2014, 6 pages.
Engineered to the task: Why camera-phone cameras are different, Giles Humpston, Publisher: Solid State Technology, Jun. 2009, 3 pages.

* cited by examiner

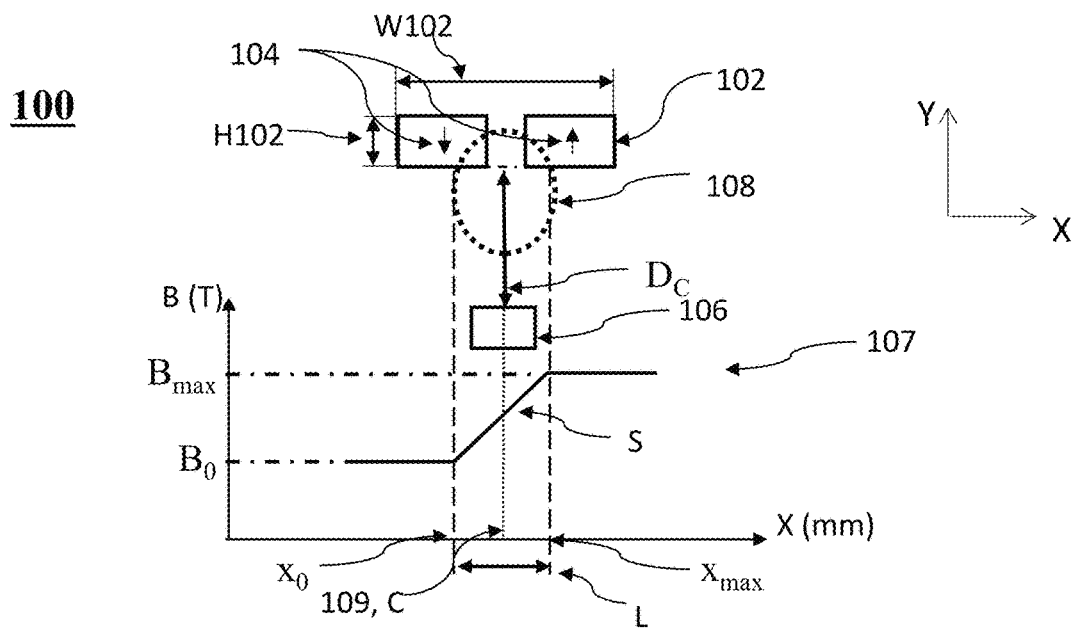
FIG. 1A  KNOWN ART
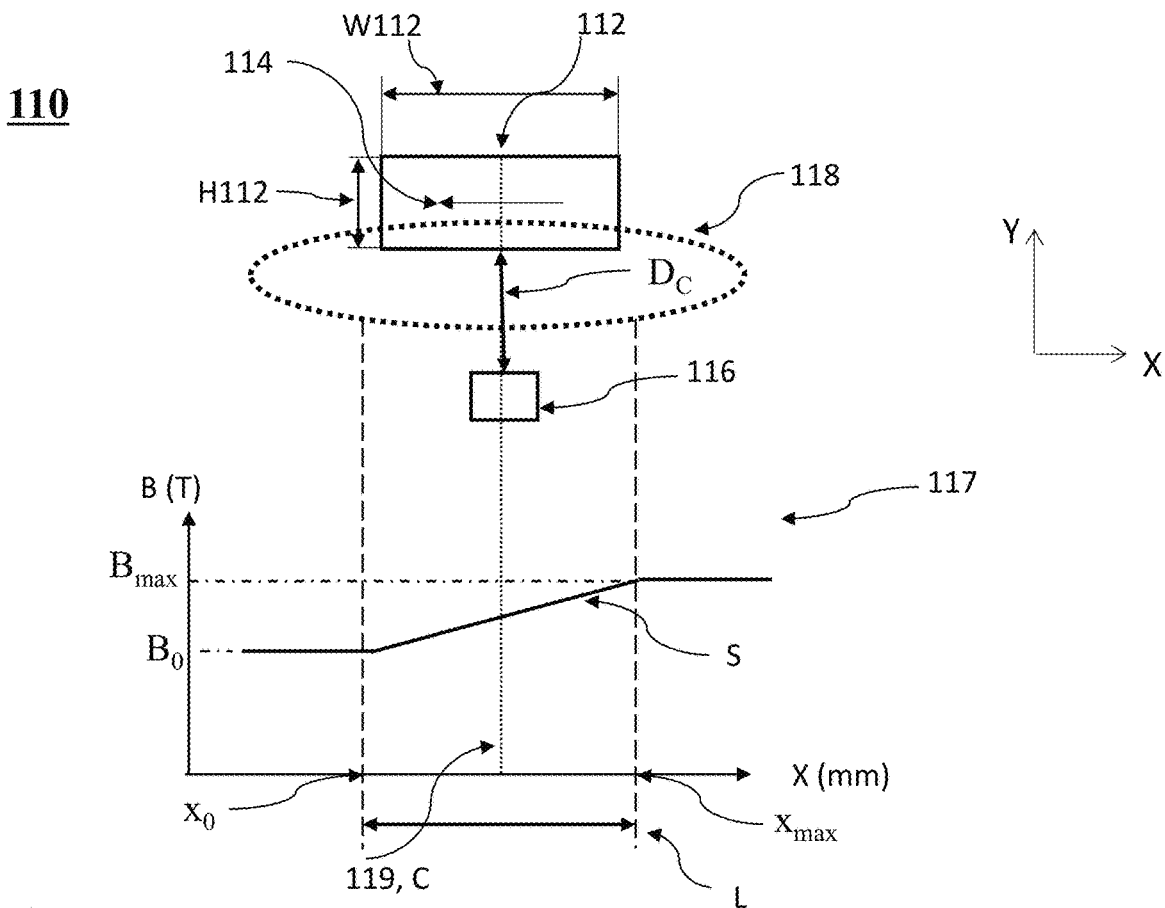
FIG. 1B  KNOWN ART

HALL SENSOR—MAGNET GEOMETRY FOR LARGE STROKE LINEAR POSITION SENSING

CROSS REFERENCE TO EXISTING APPLICATIONS

This application is a continuation from U.S. patent application Ser. No. 17/628,905 filed Jan. 21, 2022 (now allowed), which was a 371 of international patent application PCT/IB2021/056693 filed Jul. 26, 2021, and claims priority from U.S. Provisional Patent Application No. 63/059,200 filed Jul. 31, 2020, which is incorporated herein by reference in its entirety.

FIELD

Embodiments disclosed herein relate in general to position sensing units, and in particular to position sensing in compact digital cameras included in mobile electronic devices.

BACKGROUND

Many compact digital cameras that are integrated in handheld electronic devices ("devices") such as smartphones or tablets use actuators such as voice coil motors (VCMs) or stepper motors, e.g. for actuating a camera lens along a trajectory having a particular direction and range ("stroke" or "L"). The actuation is controlled by a position sensing unit, which is typically based on a magnet assembly ("MA") that moves relative to a magnetic flux measuring device (MFMD) for example a Hall sensor. For stable control, the position sensing unit must support two conditions: a) it must exhibit linear behavior, i.e. its slope $S=\Delta B/\Delta x$ must be constant along the entire stroke ("linear range"), where $\Delta B$ is the change in magnetic flux density between two points located at a distance $\Delta x$ from each other. For example, the linear range of the position sensing unit limits the stroke, and b) the slope $S=\Delta B/\Delta x$ within the linear range must be sufficiently steep, i.e. it must be above a certain threshold, e.g. S>50 mT or S>200 mT.

FIG. 1A shows a first known example of a position sensing unit 100 comprising a magnet assembly ("MA") 102. MA 102 includes two rectangular magnets with a polarizations 104, the MA having a width W102 and a MA center "C" (with respect to the x direction or just "with respect to x")) located at the symmetry axis ("SA") 109 (with respect to the y direction or just "with respect to y") of MA 102, and a MFMD 106. MA 102 causes a magnetic field 108 in its surroundings. MFMD 106 is located at a constant distance $D=D_C$ (measured along the y axis) from MA 102, which may be $D_C=0.1$ mm-2 mm. For position sensing, MA 102 moves along a substantially straight line in the x direction and relative to MFMD 106. The position of MA 102 along the straight line ("x") changes when x varies from $x_0$ to $x_{max}$ (this being the "stroke"). That is, MA moves within the stroke only. D is substantially constant between $x_0$ and Xmas, i.e. D is not a function of x. In graph 107, the magnetic flux density ("B") measured by MFMD 106 is shown versus the x position of MA 102. B is a function of x, i.e. B=B(x). Within stroke L ranging from $x_0$ to $x_{max}$, slope $S=(B_{max}-B_0)/L$ of B is linear. In some examples, W102 may be 0.6 mm-10 mm, L may be 0.5 mm-1 mm. In a typical example for focusing a camera lens, D=200 μm and L=700 μm, so that a ratio of L and D is L/D=3.5. For many actuator sensing examples, S is sufficiently steep. However, L/D is relatively small.

FIG. 1B shows a second known example of a position sensing unit 110 comprising a MA 112 that includes a single rectangular magnet having a polarization 114 and a width W112, and a MFMD 116. MA 112 causes a magnetic field 118. MFMD 116 is located at a distance D away from MA 102. Similar to the shown in FIG. 1A, a magnet center "C" (with respect to the x direction) is located at a SA 119 (with respect to the y direction) of MA 202. For position sensing, MA 112 moves along a substantially straight line in the x direction relative to MFMD 116. D is substantially constant between $x_0$ and $x_{max}$. In graph 117, the magnetic flux density B measured by MFMD 116 is shown versus the x position of MA 112. Slope $S=(B_{max}-B_0)/L$ of B is linear in a range L. L/D can be relatively large. However, for most actuator sensing scenarios, S is not sufficiently steep. Therefore, this design is hardly used in today's devices.

Novel Telephoto "(Tele") cameras entering the market have large effective focal lengths (EFL) of e.g. 10 mm-40 mm for large zoom factors and for Macro photography with high object-to-image magnifications of e.g. 1:1-15:1 at object-lens distances ("u") of 5 cm-15 cm. Focusing such a large EFL camera to a short u as small as 5 cm-15 cm requires large lens strokes significantly exceeding 1 mm.

Using the thin lens equation 1/EFL=1/u+1/v ("v" being the lens-image distance) and a Tele camera having EFL-25 mm as an example, a lens stroke of about 6.3 mm is required to focus to 10 cm (with respect to focus on infinity). Controlling such large lens strokes cannot be supported by position sensing units used at present in the compact camera industry. Further examples that require large strokes of components are, for example, (i) a 2-state zoom camera described in co-owned international patent application PCT/IB2020/051405, (ii) a pop out mechanism that collapses a camera's total track length (TTL) such as described in the co-owned international patent application PCT/IB2020/058697 and (iii) a continuous zoom camera such as described in co-owned U.S. provisional patent application No. 63/119,853 filed 1 Dec. 2020.

There is need for, and it would be beneficial to have a position sensing unit with a compact form factor that allows realizing position sensing with along large strokes L and with sufficiently large slope S.

SUMMARY

1. In various embodiments, there are provided position sensing units, comprising: a magnetic assembly (MA) having a width W measured along a first direction and a height H measured along a second direction and including at least three magnets having respective magnetic polarizations that define along the first direction at least a left MA domain, a middle MA domain and a right MA domain, wherein the magnetic polarizations of each MA domain are different; and a magnetic flux measuring device (MFMD) for measuring a magnetic flux B, wherein the MA is configured to move relative to the MFMD along the first direction within a stroke L that fulfils 1 mm≤L≤100 mm, stroke L beginning at a first point $x_0$ and ending at a final point $x_{max}$, and wherein a minimum value $D_{min}$ of an orthogonal distance D measured along the second direction between a particular MA domain of the MA and the MFMD of the position sensing unit, fulfills $L/D_{min}>10$. The magnets may be made from a Neodymium based material.

In some embodiments, the MA has a symmetry axis parallel to the second direction. In some embodiments, the symmetry axis is located at a center of the middle MA domain.

In some embodiments, D is not constant for different positions within stroke L.

In some embodiments, $L/D_{min} > 15$. In some embodiments, $L/D_{min} > 20$.

In some embodiments, B at $x_0$ is $B_0$ and B at $x_{max}$ is $B_{max}$, and a slope $S=(B_0-B_{max})/L$ is larger than 10 mT/mm. In some embodiments, S is larger than 100 mT/mm. In some embodiments, S is larger than 1000 mT/mm. In some embodiments, S is larger than 2500 mT/mm.

In some embodiments, the magnetic polarization of the left MA domain is directed towards the MFMD.

In some embodiments, the magnetic polarization of the right MA domain is directed away from the MFMD.

In some embodiments, the magnetic polarization of the middle MA domain is directed parallel or anti-parallel to the first direction.

In some embodiments, a position sensing unit as above or below may be included in a voice coil motor (VCM). In some embodiments, the VCM includes four coils. In some embodiments, the VCM is included in smartphone camera.

In some embodiments, the MFMD is a Hall sensor.

In some embodiments, a value of D between the left MA domain and MFMD is $D(x_0)$, wherein a value of D between the right MA domain and the MFMD is $D(x_{max})$, wherein a value of D between the middle MA domain and the MFMD is $D(x_{max/2})$ and wherein $D(x_0) \leq D(x_{max/2})$ and $D(x_{max}) \leq D(x_{max/2})$. In some embodiments, a value of D between the middle MA domain and the MFMD is $D(x_{max/2})$ and wherein $D(x_0)=D(x_{max}) \leq D(x_{max/2})$.

In some embodiments, the left, middle and right MA domains are rectangular. In some embodiments, the left and right MA domains are trapezoids, and the middle MA domain is a convex pentagon. In some embodiments, the left and right MA domains are trapezoids, and the middle MA domain is a concave pentagon.

In some embodiments, the MA additionally includes a fourth MA domain and a fifth MA domain having respective magnetic polarizations, wherein the fourth MA domain is located to the left of the left MA domain and wherein the fifth MA domain is located to the right of the right MA domain. In some embodiments, the magnetic polarization of the fourth MA domain is directed away from the MFMD. In some embodiments, the magnetic polarization of the fifth MA domain is directed towards the MFMD.

In some embodiments, L<20 mm. In some embodiments, L<10 mm. In some embodiments, L<7.5 mm. In some embodiments, L<5 mm.

In some embodiments, L/W>0.5. In some embodiments, L/W>0.75.

In some embodiments, L/H>3. In some embodiments, L/H>5.

BRIEF DESCRIPTION OF THE DRAWINGS

Non-limiting examples of embodiments disclosed herein are described below with reference to figures attached hereto that are listed following this paragraph. The drawings and descriptions are meant to illuminate and clarify embodiments disclosed herein, and should not be considered limiting in any way. Like elements in different drawings may be indicated like numerals.

FIG. 1A shows a first known example of a position sensing unit;

FIG. 1B shows a second known example of a position sensing unit;

DETAILED DESCRIPTION

Figure 2A:
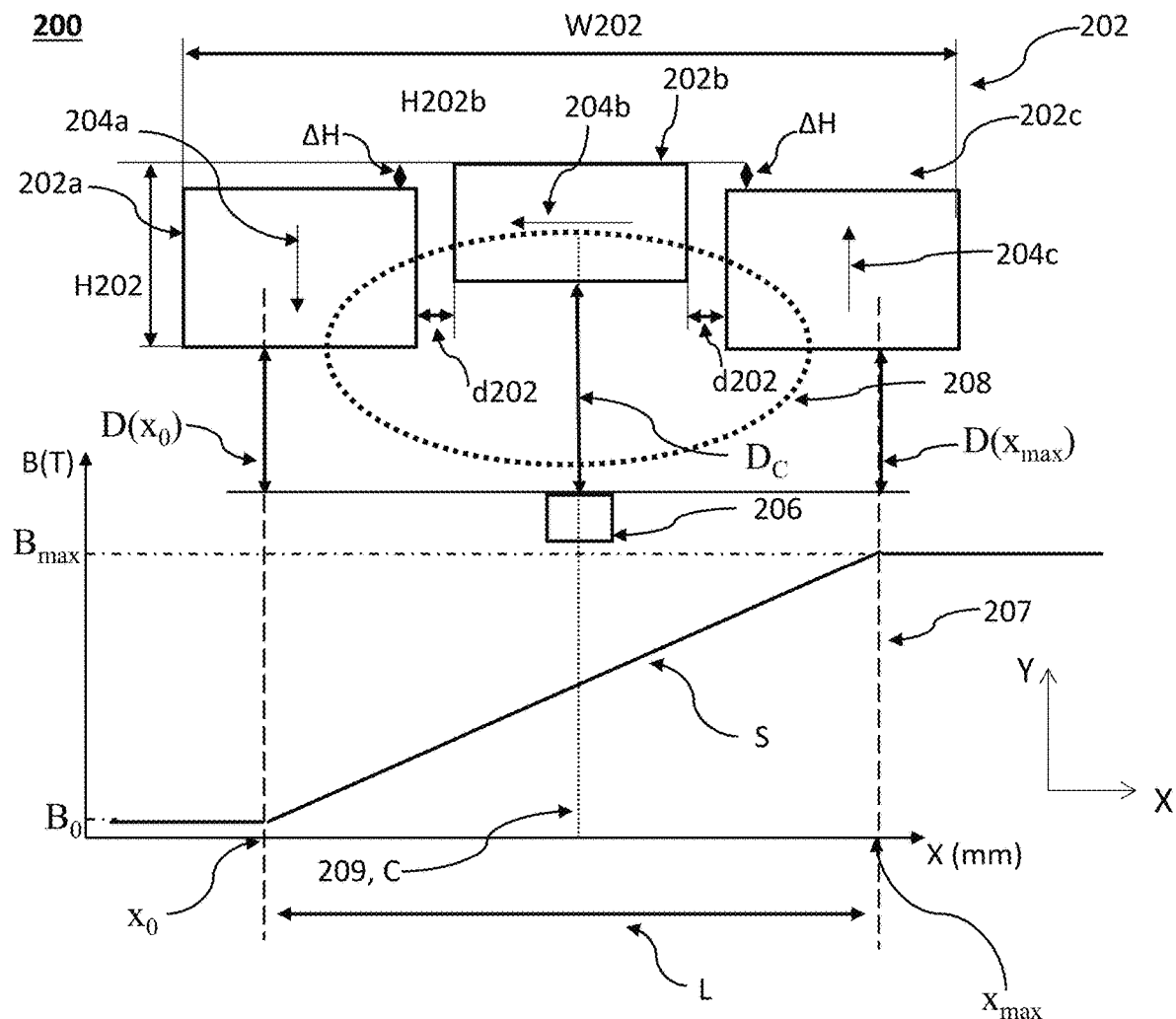
FIG. 2A shows in cross-section an embodiment of a position sensing unit disclosed herein.
Figure 2B:
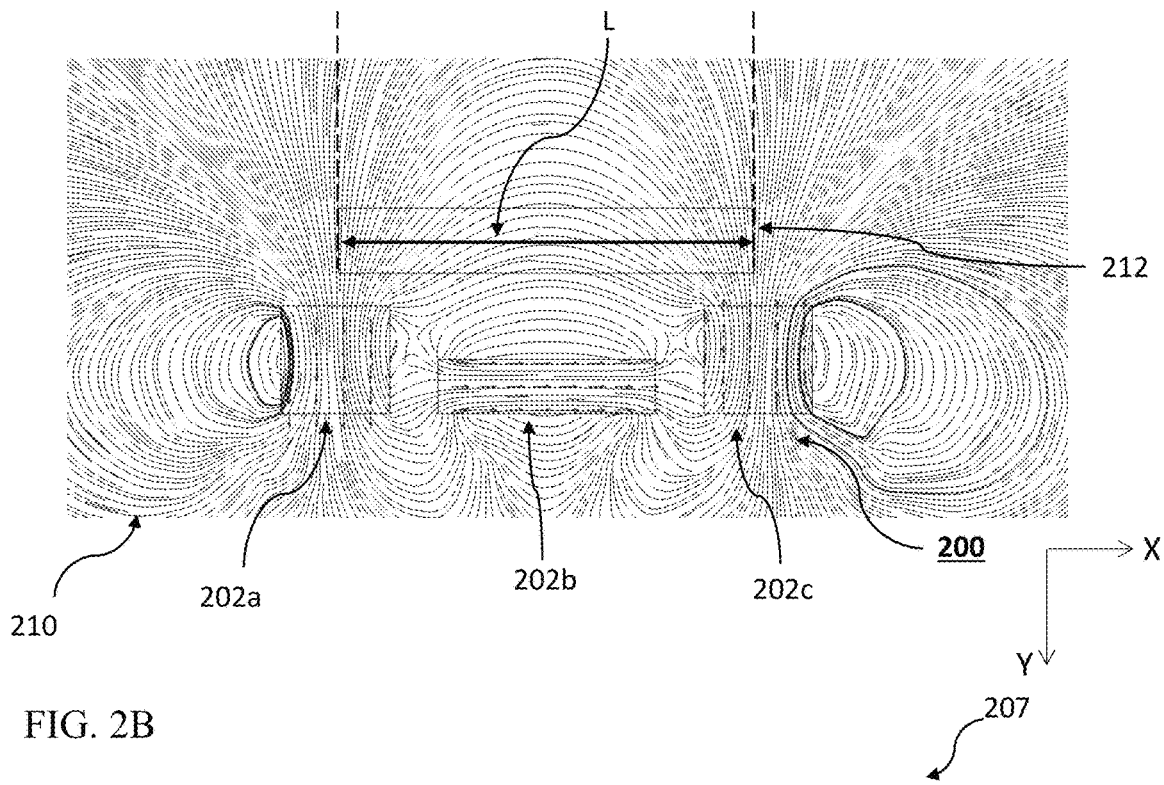
FIG. 2B shows a magnetic field distribution of a MA in the position sensing unit of FIG. 2A.
Figure 2C:
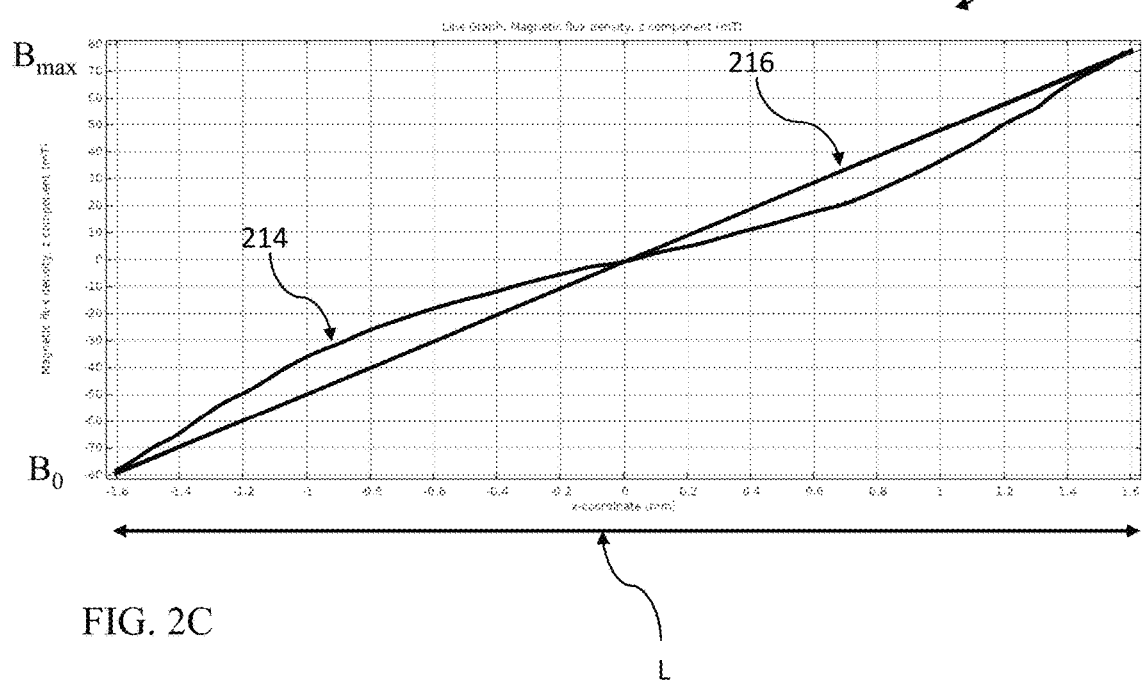
FIG. 2C shows the magnetic field density sensed by a MFMD in the position sensing unit of FIG. 2A.

FIG. 2A shows an embodiment of a position sensing unit disclosed herein and numbered 200, comprising a magnet assembly 202 and a magnetic flux measuring device 206. Graph 207 shows B measured by MFMD 106 versus the x position of MA 102. FIG. 2B shows a magnetic field distribution 210 of MA 202. Box 212 indicates a y position within stroke L where a magnetic flux density 214 as shown in FIG. 2C is sensed by MFMD 206.

MA 202 includes three rectangular permanent magnets 202a, 202b and 202c having respective magnetic polarizations 204a, 204b and 204c. Magnets 202a and 202c are identical in shape and dimensions, but opposite respective magnetizations 204a and 204c. Magnets 202a and 202c are positioned symmetrically with respect to magnet 202b, i.e. both magnets 202a and 202c are (i) located at a same distance d202 from magnet 202b and (ii) are positioned at a same relative y coordinate ΔH with respect to magnet 202b. A center "C" of MA 202 is located at symmetry axis SA 209 of both magnet 202b and MA 202. MA 202 is shaped symmetrically around C with respect to y. MA 202 has a width W202 and a height H202.

Magnets described herein may be made from any material known to be used in the industry, specifically in digital cameras used in mobile electronic devices such as smartphones, for example any Neodymium based material, e.g. N48H, N48SH etc. $x_0$ and $x_{max}$ may be chosen so that their middle or symmetry point $x_S=x_{max}/2$ is located at C, or they may be chosen otherwise. That is, the symmetry axis of the stroke with respect to y is located at $x_S=x_{max}/2$ and may be identical with the SA 209 of MA 202 located at C (such as shown in FIG. 2A) or it may be located at another position.

The orthogonal distance between any component included in MA 202 and MFMD 206 is marked "D". "Orthogonal distance" means that it represents only the y-component of a distance between any component included in MA 202 and MFMD 206. Values of D at points $x_0$, C and $x_{max}$ are marked respectively $D(x_0)$, $D_C$ and $D(x_{max})$. At $x_0$ and Xmas, D has a minimal value $D_{min}$.

As an example, D between magnet 202a and MFMD 206 is $D(x_0)$ and D between magnet 202b and MFMD 206 is $D_C$, irrespective from the actual relative distance between magnet 202a and 202b respectively and MFMD 206. As to the relative motion of MA 202 and MFMD 206, in general an actual relative distance is composed of a distance component measured along x and a distance component measured along y. It is noted here that D refers to a distance between a magnet and a packaging device that includes a MFMD, and not to the distance the MFMD itself. In general, a MFMD is included in a packaging device having a housing, wherein the MFMD is located at a MFMD-housing distance of about 50 μm-250 μm from the housing. For calculating the distance between a magnet and the MFMD, the MFMD-housing distance must be added to D. Additionally, it is noted that D is not shown in scale.

In all examples shown herein, $D(x_0)$ and $D(x_{max})$ can be smaller than or equal to $D(x)$ fulfilling $D(x_0)$, $D(x_{max}) \leq D(x)$. The closest distance between one of the magnets and the MFMD $D_{min}=D(x_0)=D_{max}$. That is, $D(x_0)$ and $D(x_{max})$ are smaller than or equal to all other distances in that range. In position sensing unit 200, $D(x_0)=D(x_{max})<D_C$ and $L/D_{min}>10$. Typically, $D_{min} \geq 0.1$ mm.

At $x_0$, magnetic polarization 204a is directed substantially towards MFMD 206. At $x_{max}$, magnetic polarization 204c is directed substantially away from MFMD 206. At C, magnetic polarization 204b is directed substantially in parallel or anti-parallel to X. Magnets 202a, 202b and 202c define three MA domains, a left, a middle and a right MA domain respectively, wherein the magnet polarizations of each MA domain are different from each other.

Magnetic flux density B is a function of x, i.e. B=B(x). In L, the slope $S=(B_{max}-B_0)/\Delta x$ of B is linear. In all following examples, S is given for an ideally linear slope such as 216 (see FIG. 2C) which has a same starting point $(x_0, B_0)$ and a same end point $(x_{max}, B_{max})$ as an actual slope 214 (see FIG. 2C). Values of S are given at $D_C$.

As mentioned, graph 207 in FIG. 2C shows magnetic flux densities versus x, so it is a "B vs. x curve". Actual magnetic flux density slope 214 is sensed along the coordinates indicated by the arrow L in FIG. 2A. Ideal (linear) magnetic flux density slope 216 is shown for comparison. Clearly, actual magnetic flux density slope 214 deviates from ideal magnetic flux density slope 216.

Figure 3:
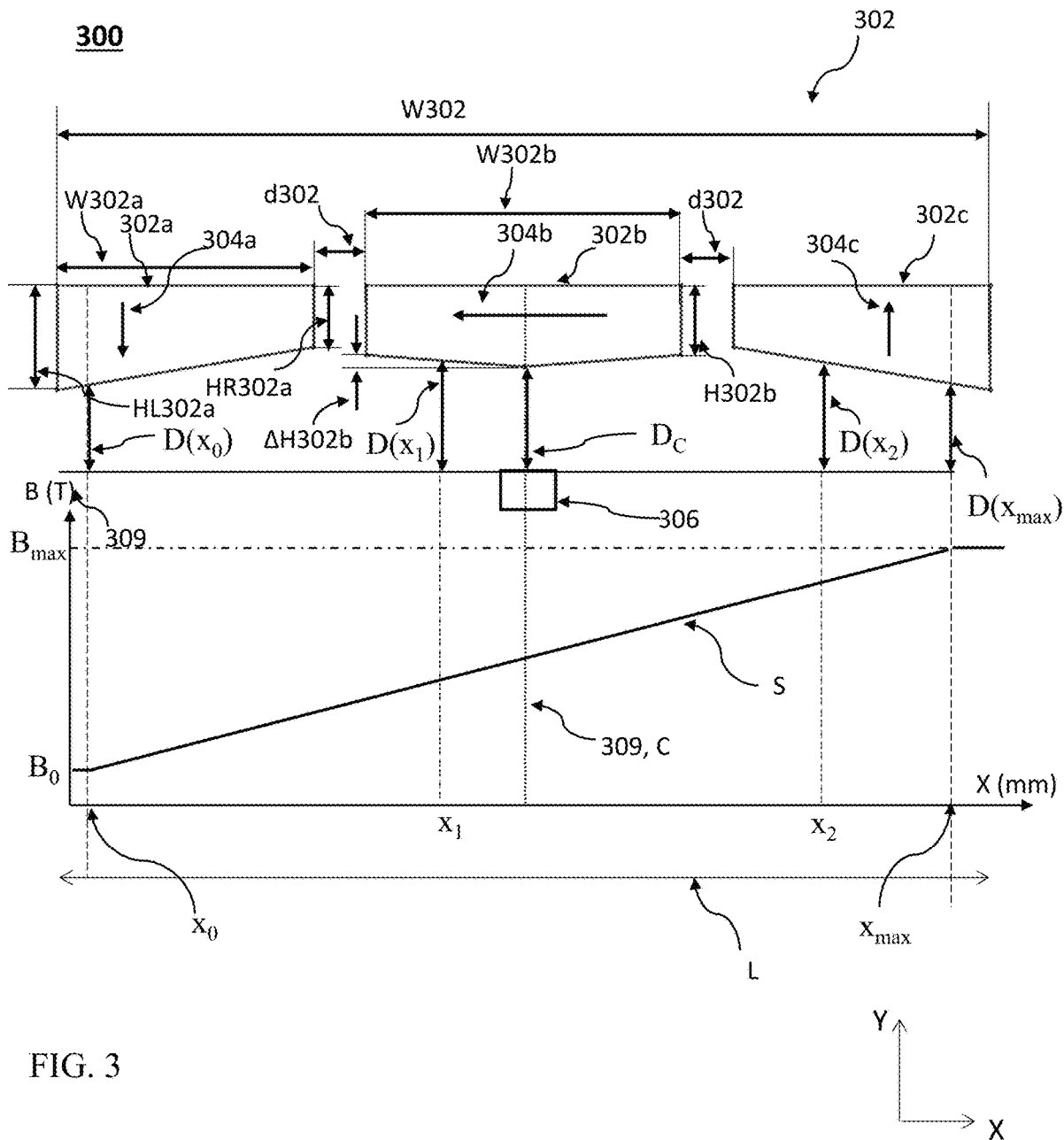
FIG. 3 shows in cross-section another embodiment of a position sensing unit disclosed herein.

FIG. 3 shows another embodiment of a position sensing unit disclosed herein and numbered 300. Unit 300 comprises a MA 302 that includes three permanent magnets 302a, 302b and 302c having respective magnetic polarizations 304a, 304b and 304c, and a MFMD 306. Magnets 302a, 302b and 302c are not rectangular. Magnets 302a and 302c have identical shape and dimensions, but opposite magnetization 304a and 304c. Magnets 302a and 302c are positioned symmetrically with respect to 302b, i.e. both 302a and 302c are (i) located at a same distance d302 from 302b and (ii) are positioned at a same relative y coordinate ΔH302 with respect to 302b. Center C of MA 302 (with respect to x) is located at the SA 309 (with respect to y) of both magnet 302b and MA 302. MA 302 is shaped symmetrically around C with respect to y.

MA 302 causes a magnetic field (not shown). At C, MFMD 306 is located at $D_C$ away from MA 302. MA 302 moves along a stroke in x direction relative to MFMD 306. The position of MA 302 along x varies from $x_0$ to $x_{max}$. $x_0$ and $x_{max}$ may be chosen so that their middle or symmetry point $x_s=x_{max}/2$ is located at C, or they may be chosen otherwise. It is noted that D is not shown in scale.

Between $x_0$ and $x_{max}$, orthogonal distance D is a function of x, D=D(x). For 300, $D(x_0)=D(x_{max})<D_C$, $D(x_0)=D(x_{max})=D_{min}$ and $L/D_{min} \geq 10$. Typically, $D_{min} \geq 0.1$ mm. For the purpose of illustrating the definition of D, D is shown at 2 further, arbitrary positions $x_1$ and $x_2$, where D is given by $D(x_1)$ and $D(x_2)$ respectively. At $x_0$, magnetic polarization 304a is substantially directed towards MFMD 306. At $x_{max}$, 304c is substantially directed away from MFMD 306. At C, 304b is directed substantially parallel or anti-parallel to x. Magnets 302a, 302b and 302c define three MA domains, a left, a middle and a right MA domain respectively, wherein the magnet polarizations of each MA domain are different from each other.

B 309 measured by MFMD 306 is shown versus the x position of MA 202 ("B versus x curve"). B is a function of x, i.e. B=B(x). In L, $S=(B_{max}-B_0)/\Delta x$ of B is linear. Example values of given in Table 1. Values of S are given at $D_C$. An advantage of MA 302 over MA 202 is that a B versus x curve within L exhibits a higher linearity. That is, the B vs. x curve of MA 302 varies less from an ideal linear shape such as 216 than the B vs. x curve of MA 202.

TABLE 1

|  | Value | Unit |
| --- | --- | --- |
| W302 | 8 | mm |
| H302 | See HL302a |  |
| W302a | 2.2 | mm |
| HL302a | 0.9 |  |
| HR302a | 0.55 |  |
| W302b | 2.7 |  |
| H302b | 0.6 |  |
| d302 | 0.45 |  |
| ΔH302b | 0.1 |  |
| S | 10-6000 | mT/mm, at $D_C$. |
| L | 7.5 | mm |
| $D_C$ | 0.2-1 | mm |
| $D_{min}$ | 0.1-0.7 | mm |
| L/W302 | 0.94 |  |
| L/H302 | 8.33 |  |
| HL302a/HR302a | 1.64 |  |
| H302b/ΔH302b | 6 |  |
| $L/D_{min}$ | 10.7-75 |  |

Figure 4:
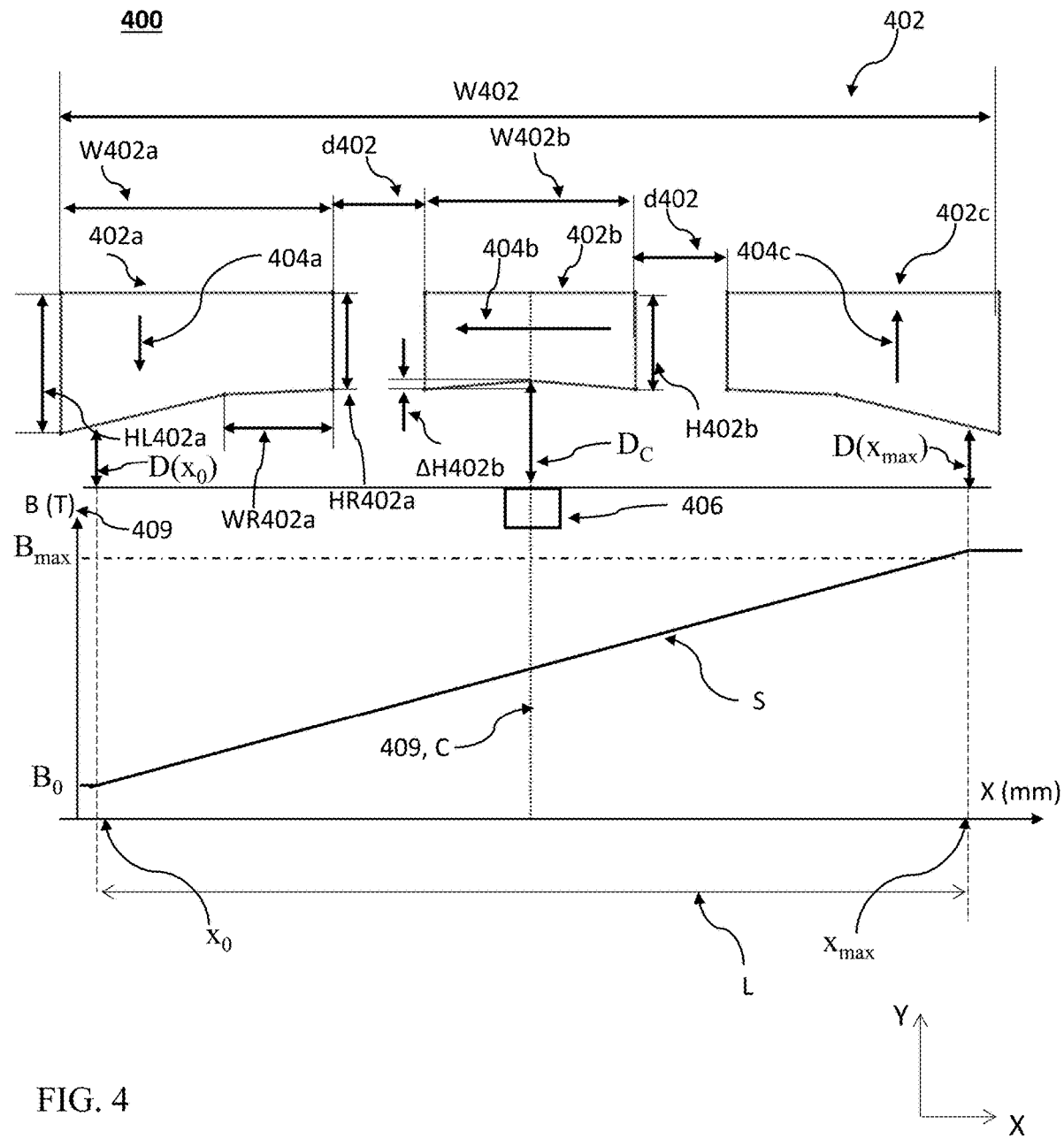
FIG. 4 shows in cross-section yet another embodiment of a position sensing unit disclosed herein.

FIG. 4 shows yet another embodiment of a position sensing unit disclosed herein and numbered 400. Unit 400 comprises a MA 402 that includes three non-rectangular permanent magnets 402a, 402b and 402c having respective magnetic polarization 404a, 404b and 404c, and a MFMD 406. Magnets 402a and 402c have the same shape and dimensions, but opposite magnetizations 404a and 404c. Magnets 402a and 402c are positioned symmetrically with respect to 402b, i.e. both 402a and 402c are (i) located at a same distance d402 from 402b and (ii) are positioned at a same relative Y coordinate ΔH402 with respect to 402b. Center C of MA 402 (with respect to x) is located at the SA 409 (with respect to y) of both magnet 402b and MA 402. MA 402 is shaped symmetrically around C with respect to y.

MA 402 causes a magnetic field (not shown). At C. MFMD 406 is located at $D_C$ away from MA 402. MA 402 moves along a stroke in x direction relative to MFMD 406. The position of MA 402 along x varies from $x_0$ to $x_{max}$. $x_0$ and $x_{max}$ may be chosen so that their middle or symmetry point $x_s=x_{max}/2$ is located at C, or they may be chosen otherwise.

Between $x_0$ to $x_{max}$, orthogonal distance D is a function of x, D=D(x). For 400, $D(x_0)=D(x_{max})<D_C$, $D(x_0)=D(x_{max})=D_{min}$ and $L/D_{min}>10$. Typically, $D_{min} \geq 0.1$ mm. At $x_0$, the magnetic polarization 404a is substantially directed towards MFMD 406. At $x_{max}$, 404c is substantially directed away from MFMD 406. At C, 404b is directed substantially parallel or anti-parallel to X. Magnets 402a, 402b and 402c define three MA domains, a left, a middle and a right MA domain respectively, wherein the magnet polarizations of each MA domain are different from each other. It is noted that D is not shown in scale.

B 409 measured by MFMD 406 is shown versus the x position of MA 202. B is a function of x, i.e. B=B(x). In L, $S=(B_{max}-B_0)/\Delta X$ of B is linear. Example values of position sensing unit 400 are given in Table 2. Values of S are given at $D_C$. An advantage of MA 402 over MA 202 is that a B versus x curve within L exhibits a higher linearity.

TABLE 2

|  | Value | Unit |
|---|---|---|
| W402 | 5.35 |  |
| H402 | See HL402a |  |
| W402a | 1.55 |  |
| HL402a | 0.8 |  |
| HR402a | 0.55 |  |
| WR402a | 0.625 |  |
| W402b | 1.2 |  |
| H402b | 0.55 |  |
| d402 | 0.525 |  |
| ΔH402b | 0.05 |  |
| S | 10-6000 | mT/mm, at $D_C$ |
| L | 5 | mm |
| $D_{min}$ | 0.1-0.5 | mm |
| $D_C$ | 0.2-1 | mm |
| L/W402 | 0.93 |  |
| L/H402 | 6.25 |  |
| HL402a/HR402a | 1.45 |  |
| H402b/ΔH402b | 11 |  |
| $L/D_{min}$ | 10.0-50 |  |

Figure 5A:
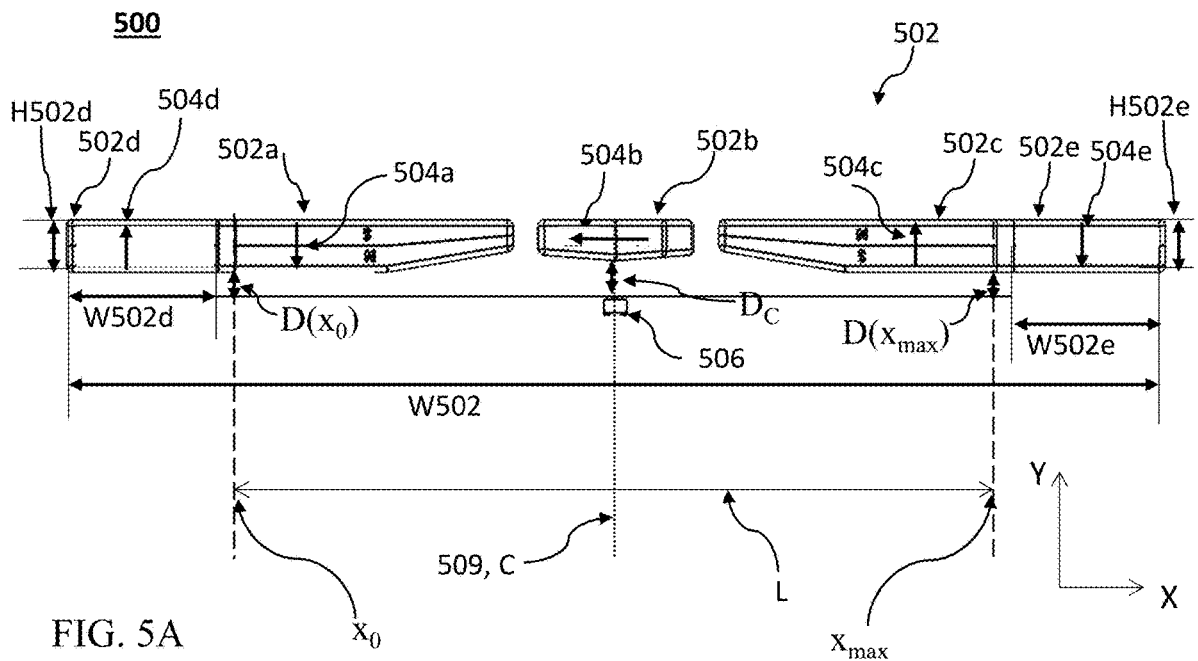
FIG. 5A shows in cross-section yet another embodiment of a position sensing unit disclosed herein.

FIG. 5A shows yet another embodiment of a position sensing unit disclosed herein and numbered 500. Unit 500 comprises a MA 502 that includes five permanent magnets 502a, 502b, 502c, 502d and 502e having respective magnetic polarizations 504a, 504b, 504c, 504d and 504e, and a MFMD 506. Magnets 502a, 502b and 502c are not rectangular, while magnets 502d and 502e are rectangular. Magnets 502a and 502c as well as 502d and 502e have the same shape and dimensions, but opposite magnetizations 504a and 504c and 504d and 504e respectively. Magnets 502a, 502c, 502d and 502e are positioned symmetrically with respect to magnet 502b. A magnet sub-assembly including magnets 502a, 502b and 502c is identical with MA 302 shown in FIG. 3. Center C of MA 502 (with respect to x) is located at the SA 509 (with respect to y) of both magnet 502b and MA 502. MA 502 is shaped symmetrically around C with respect to y.

MA 502 causes a magnetic field (not shown). At C, MFMD 506 is located at De away from MA 502. MA 502 moves along a stroke in x direction relative to MFMD 506. The position of MA 502 along x varies from $x_0$ to $x_{max}$. $x_0$ and $x_{max}$ may be chosen so that their middle or symmetry point $x_s=x_{max}/2$ is located at C, or they may be chosen otherwise.

Between $x_0$ to $x_{max}$, orthogonal distance D is a function of x, D=D(x). For 500, $D(x_0)=D(x_{max})<D_C$, $D(x_0)=D(x_{max})=D_{min}$ and $L/D_{min}>10$. Typically, $D_{min}\geq 0.1$ mm. At $x_0$, the magnetic polarization 504a is substantially directed towards MFMD 506. At $x_{max}$, 504c is substantially directed away from MFMD 506. At C, 504b is directed substantially parallel or anti-parallel to X. 504d is directed substantially anti-parallel to 504a. 504e is directed substantially anti-parallel to 504c. Additionally to the three MA domains defined by magnets 502a, 502b and 502c, in MA 502 there are two additional MA domains defined by magnets 502d and 502e.

B (not shown) is measured by MFMD 506 versus the x position of MA 202. B is a function of x, i.e. B=B(x). In L, $S=(B_{max}-B_0)/\Delta X$ of B is linear. Example values of given in Table 3. For the values of magnet sub-assembly including magnets 502a, 502b and 502c see magnets 302a, 302b and 302c of Table 1 respectively. Values of S are given at $D_C$.

An advantage of MA 502 over MA 302 is that a B versus x curve has a higher linearity for the same dimensions of magnets 502a, 502b and 502c (which have the same dimensions as magnets 302a, 302b and 302c).

TABLE 3

|  | Value | Unit |
|---|---|---|
| W502 | 19.2 | mm |
| H502 | See H502d | mm |
| W502d, W502e | 2.55 | mm |
| H502d, H502e | 0.9 | mm |
| S | 10-6000 | mT/mm, at $D_C$ |
| L | 13.4 | mm |
| $D_{min}$ | 0.1-1 | mm |
| $D_C$ | 0.2-0.9 | mm |
| L/W502 | 0.70 |  |
| L/H502 | 14.89 |  |
| $L/D_{min}$ | 13.4-134 |  |

Figure 5B:
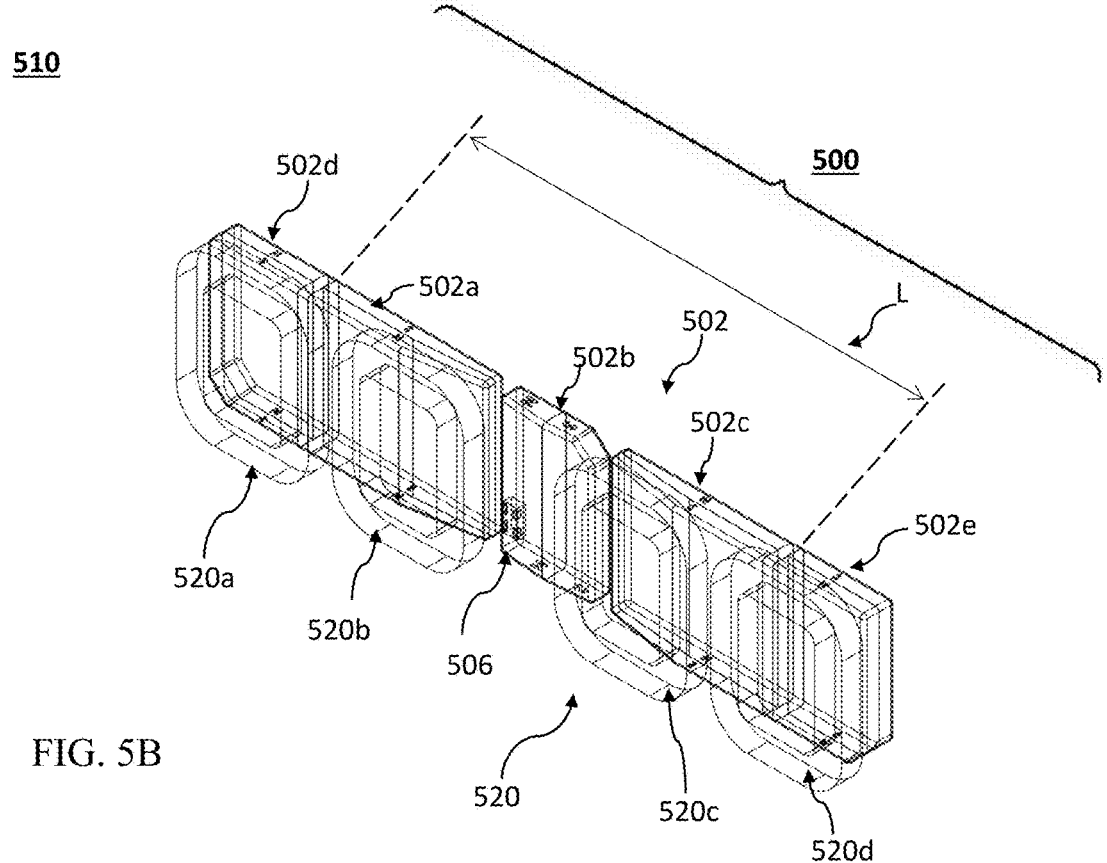
FIG. 5B shows an embodiment of a voice coil motor ("VCM") disclosed herein.

FIG. 5B shows an embodiment of a voice coil motor ("VCM") disclosed herein and numbered 510. VCM 510 includes a coil assembly ("CA") 520 and position sensing unit 500. CA 520 includes four coils 520a, 520b, 520c and 520d and can generate a magnetic field.

Figure 5C:
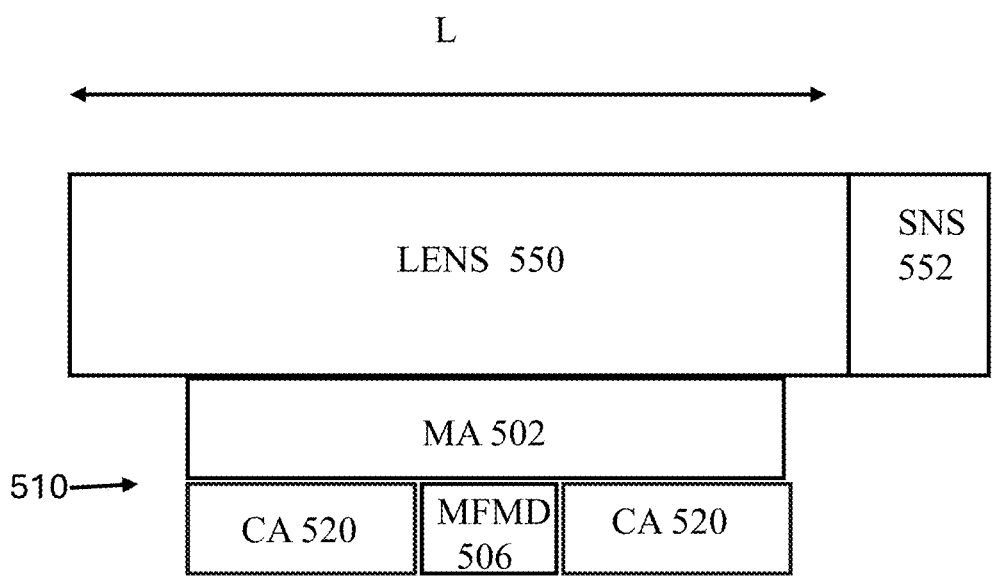
FIG. 5C shows an embodiment of a camera including a lens assembly, a sensor, and a voice coil motor (VCM) including a position sensing unit attached to the lens assembly disclosed herein.

In VCM 510, the magnetic field caused by position sensing unit 500 additionally provides, together with the magnetic field generated by CA 520, the magnetic field configuration which is required for actuating a relative motion between MA 502 and CA 520 as well as MFMD 506. Typically and with respect to a device that includes VCM 510, MFMD 506 and CA 520 are at rest and MA 502 moves. In some examples for lens focusing in devices that include a camera, as shown in exemplary FIG. 5C. MA 502 may be fixedly coupled to a camera's lens (LENS) 550 for actuating the lens with respect to camera's image sensor (SNS) 552 which is at rest with respect to the device. An advantage of MA 502 over MA 302 is that it allows a faster VCM actuation.

In other embodiments, a VCM like VCM 510 may include position sensing unit 200, 300 or 400.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element.

Furthermore, for the sake of clarity the term "substantially" is used herein to imply the possibility of variations in values within an acceptable range. According to one example, the term "substantially" used herein should be interpreted to imply possible variation of up to 10% over or under any specified value. According to another example, the term "substantially" used herein should be interpreted to imply possible variation of up to 5% over or under any specified value. According to a further example, the term "substantially" used herein should be interpreted to imply possible variation of up to 2.5% over or under any specified value.

All references mentioned in this specification are herein incorporated in their entirety by reference into the specification, to the same extent as if each individual reference was specifically and individually indicated to be incorporated herein by reference. In addition, citation or identification of any reference in this application shall not be construed as an admission that such reference is available as prior art to the present invention.

What is claimed is:

1. A camera, comprising:
   a lens;
   a stationary image sensor;
   a magnetic assembly (MA) fixedly coupled to the lens and having a width W measured along a first direction associated with a direction of actuation of the lens relative to the stationary sensor, and a height H measured along a second direction that is perpendicular to the first direction, the MA including at least three magnets having respective magnetic polarizations that define along the first direction at least a left MA domain, a middle MA domain and a right MA domain, wherein the magnetic polarizations of each of the MA domains are different; and
   a stationary magnetic flux measuring device (MFMD) for measuring a magnetic flux B, wherein the MA is configured to move relative to the MFMD along the first direction within a range defined by a stroke L that fulfils 1 mm≤L≤100 mm,
   wherein a minimum value $D_{min}$ of an orthogonal distance D measured along the second direction between a particular magnet and the MFMD of the position sensing unit fulfills $L/D_{min}>10$,
   wherein the at least three magnets are positioned sequentially along the first direction,
   and wherein adjacent magnets are separated by a gap.

2. The camera of claim 1, wherein the lens has an effective focal length EFL in the range of 10 mm to 40 mm.

3. The camera of claim 1, wherein the MA has a symmetry axis parallel to the second direction.

4. The camera of claim 1, wherein D is not constant for different positions within stroke L.

5. The camera of claim 1, wherein the magnetic polarization of the left MA domain is directed towards the MFMD and the magnetic polarization of the right MA domain is directed away from the MFMD.

6. The camera of claim 1, wherein the magnetic polarization of the middle MA domain is directed parallel or anti-parallel to the first direction.

7. The camera of claim 1, wherein the left, middle and right MA domains are rectangular.

8. The camera of claim 1, wherein the left and right MA domains are trapezoids, and the middle MA domain is a pentagon.

9. The camera of claim 1, wherein the MA includes a fourth MA domain and a fifth MA domain having respective magnetic polarizations, wherein the fourth MA domain is located to the left of the left MA domain and wherein the fifth MA domain is located to the right of the right MA domain.

10. The camera of claim 1, wherein L<20 mm.

11. The camera of claim 1, wherein L<5 mm.

12. The camera of claim 1, wherein L/W>0.5.

13. The camera of claim 1, wherein L/H>5.

14. The camera of claim 1, wherein $L/D_{min}>15$.

15. The camera of claim 1, wherein stroke L starts at a first point $x_0$ and ends at a final point $x_{max}$, wherein a value of D between the left magnet and MFMD is $D(x_0)$, wherein a value of D between the right magnet and the MFMD is $D(x_{max})$, wherein a value of D between the middle magnet and the MFMD is $D(x_{max}/2)$ and wherein $D(x_0) \leq D(x_{max}/2)$ and $D(x_{max}) \leq D(x_{max}/2)$.

16. The camera of claim 1, wherein stroke L starts at a first point $x_0$ and ends at a final point $x_{max}$, wherein a value of D between the left magnet and MFMD is $D(x)$, wherein a value of D between the right magnet and the MFMD is $D(x_{max})$, wherein a value of D between the middle magnet and the MFMD is $D(x_{max}/2)$ and wherein $D(x_0)=D(x_{max}) \leq D(x_{max}/2)$.

17. The camera of claim 1, wherein the MA and the MFMD are included in a voice coil motor (VCM).

18. The camera of claim 17, wherein the VCM includes four coils.

19. The camera of claim 1, wherein the camera is included in a mobile device.

20. The camera of claim 19, wherein the mobile device is a smartphone.

* * * * *